US010439421B2

(12) United States Patent
Jefremow et al.

(10) Patent No.: US 10,439,421 B2
(45) Date of Patent: Oct. 8, 2019

(54) LINEAR CHARGER CIRCUIT AND METHOD OF OPERATING LINEAR CHARGER CIRCUIT

(71) Applicant: Dialog Semiconductor (UK) Limited, London (GB)

(72) Inventors: Mihail Jefremow, Augsberg (DE); Selcuk Talay, Istanbul (TR); Fabio Rigoni, Karlsfeld (DE)

(73) Assignee: Dialog Semiconductor (UK) Limited, London (GB)

( * ) Notice: Subject to any disclaimer, the term of this patent is extended or adjusted under 35 U.S.C. 154(b) by 199 days.

(21) Appl. No.: 15/664,636

(22) Filed: Jul. 31, 2017

(65) Prior Publication Data
US 2019/0036353 A1   Jan. 31, 2019

(51) Int. Cl.
*H02J 7/00* (2006.01)
*H02J 7/04* (2006.01)
*H03K 5/24* (2006.01)
*G05F 1/00* (2006.01)

(52) U.S. Cl.
CPC .............. *H02J 7/008* (2013.01); *G05F 1/00* (2013.01); *H03K 5/24* (2013.01)

(58) Field of Classification Search
USPC ....... 320/137, 162, 128, 134, 107, 129, 164, 320/145, 157, 158, 159
See application file for complete search history.

(56) References Cited

U.S. PATENT DOCUMENTS

| | | | | |
|---|---|---|---|---|
| 8,487,692 B1* | 7/2013 | Chen | ............. | H03K 17/164 |
| | | | | 327/538 |
| 2007/0029975 A1* | 2/2007 | Martin | ............ | H02J 7/0068 |
| | | | | 320/134 |
| 2010/0231172 A1* | 9/2010 | Bastami | ............ | H02J 7/0052 |
| | | | | 320/137 |
| 2011/0050164 A1* | 3/2011 | Partovi | ............ | H01F 5/003 |
| | | | | 320/108 |
| 2013/0221926 A1* | 8/2013 | Furtner | ............ | G06F 1/263 |
| | | | | 320/129 |
| 2013/0221940 A1* | 8/2013 | Yan | ............ | G05F 1/565 |
| | | | | 323/273 |
| 2014/0159807 A1* | 6/2014 | Sun | ............ | H03K 5/2481 |
| | | | | 327/538 |
| 2015/0177757 A1* | 6/2015 | Bhattad | ............ | G05F 1/573 |
| | | | | 323/281 |

(Continued)

*Primary Examiner* — Alexis B Pacheco
(74) *Attorney, Agent, or Firm* — Saile Ackerman LLC; Stephen B. Ackerman (57) ABSTRACT

A linear charger circuit and method for providing an output current at an output node is presented. The circuit contains a pass device connected between an input node and the output node, first and second replica devices connected in parallel to the pass device, with their control terminals coupled to a control terminal of the pass device. The first replica device is coupled to a first circuit path for determining whether current output by the linear charger circuit shall be terminated. The second replica device is coupled to a second circuit path for providing feedback for controlling the pass device, a control circuit coupled to the second circuit path for controlling the pass device based on a quantity indicative of a current flowing through the second circuit path, and a switching circuit coupled to the second circuit path.

32 Claims, 7 Drawing Sheets

(56) References Cited

U.S. PATENT DOCUMENTS

2016/0087462 A1* 3/2016 Kudo .................... H02J 7/0068
320/162
2017/0063223 A1* 3/2017 Raghupathy ............ H02M 3/07

* cited by examiner

LINEAR CHARGER CIRCUIT AND METHOD OF OPERATING LINEAR CHARGER CIRCUIT

TECHNICAL FIELD

This application relates to linear charger circuits and methods for operating linear charger circuits. The application particularly relates to such circuits and methods that allow for increased accuracy in sensing and controlling a charge current and in determining that a termination current at which charging shall be terminated has been reached. These circuits and methods are particularly, though not exclusively, applicable to portable Internet of Things (IoT) devices.

BACKGROUND

Figure 2:
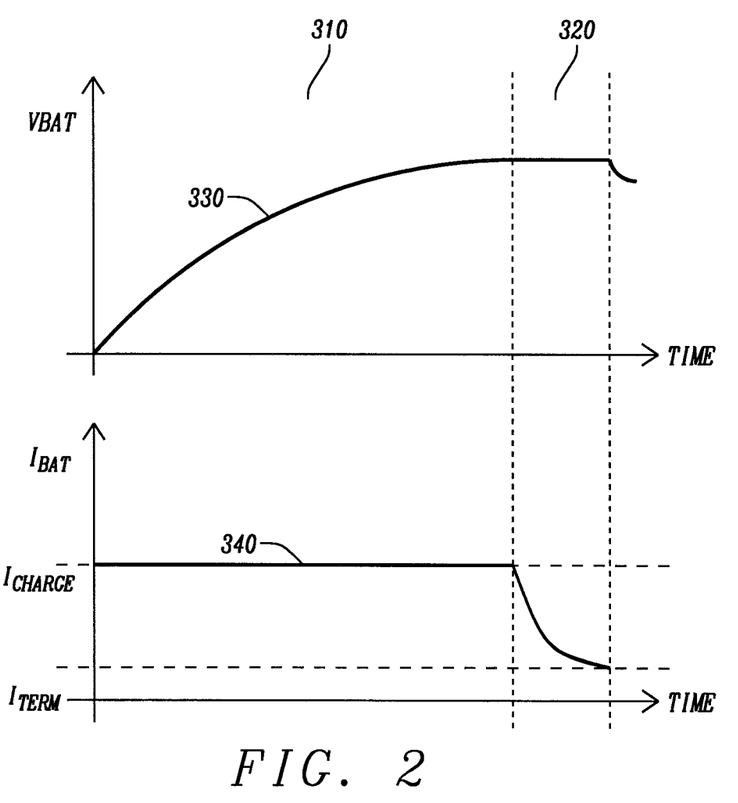

Linear charger circuits are widely used for portable IoT devices. Wearable devices like fitness bands and watches require chargers with widely adjustable charge current capability e.g. 5 mA up to 500 mA. In this charge current region the accuracy of the charging current as well as the termination current accuracy play a significant role. High accuracy allows delivering fast charge rates to the IoT device. FIG. 2 shows a typical battery current $I_{BAT}$ to voltage VBAT relationship 310 of a linear charger circuit. Typically, a charge operation has two phases, a first charging phase 330 and a second charging phase 320. During the first charging phase 330, charge current is supplied to an electric load (e.g., battery) at a constant charge current value $I_{CHARGE}$ under control of a constant current (CC) loop. The first charging phase 330 may also be referred to as CC charging phase. As soon as a certain (target) voltage value is reached by the voltage VBAT of the electric load, charging continues, in the second charging phase 320, but now the charge current is supplied at constant voltage under control of a constant voltage (CV) loop. The second charging phase 320 may also be referred to as CV charging phase. The charge operation terminates once the actual charge current $I_{BAT}$ reaches the value of the termination current $I_{TERM}$.

One of the main specification parameters for the linear charger circuit is the accuracy of the constant charge current in the constant current loop, $I_{CHARGE}$. The second important linear charger circuit specification parameter is the accuracy of the termination current $I_{TERM}$, i.e., the current at which the charge operation is actually terminated.

The accuracy of the charge current $I_{CHARGE}$ and the termination current $I_{TERM}$ is in both cases defined by the constant current CC loop structure, as both of them depend on a sense ratio (in terms of device sizes) between a pass device and a sense device of the linear charger circuit.

For high charge currents ranges (e.g., $I_{CHARGE}$>200 mA) the accuracy of the CC loop typically is sufficient and single digit accuracy is typically achievable for the charge current. However, for lower charge current ranges such as for charge currents that occur in the second charging phase 320 in FIG. 2, the accuracy of the CC loop significantly degrades, due to the comparatively large sense ratio between the pass device and the sense device (in terms of device sizes). Accordingly, termination of the charge operation at the intended termination current cannot be guaranteed. On the other hand, reducing the sense ratio would result in unnecessarily high current consumption, and hence lower power efficiency, for high charge currents.

SUMMARY

Thus, there is a need for an improved linear charger circuit for providing an output current at an output node, and for an improved method of operating a linear charger circuit (or an improved method of providing an output current at an output node). There further is a need for such circuit and method that increase the accuracy of current sensing both during the CC charging phase and the CV charging phase (i.e., that increase the charge and termination current accuracy). There further is a need for such circuit and method that do not increase overall power consumption. In view of some or all of these needs, the present disclosure proposes a linear charger circuit for providing an output current at an output node and a method of operating a linear charger circuit, having the features of the respective independent claims.

An aspect of the disclosure relates to a linear charger circuit for providing an output current at an output node. The linear charger circuit may be adapted to operate in a constant current (CC) mode and a constant voltage (CV) mode. The linear charger circuit may include a pass device coupled (e.g., connected) between an input node and the output node of the linear charger circuit. The linear charger circuit may further include first and second replica devices (sense devices) coupled (e.g., connected) in parallel to the pass device. The first and second replica devices may be portions of a replica device (sense device) coupled (e.g., connected) in parallel to the pass device. Control terminals (e.g., gate terminals) of the first and replica devices may be coupled to a control terminal (e.g., gate terminal) of the pass device. The first and second replica devices may form a current mirror with the pass device. The first replica device may be coupled to a first circuit path (first current path, first sense path) for determining whether current output by the linear charger circuit shall be terminated. For example, said determination may be performed based on a quantity indicative of a current flowing through the first circuit path (first quantity). The second replica device may be coupled to a second circuit path (second current path, second sense path) for providing feedback for controlling the pass device. The linear charger circuit may further include a control circuit coupled to the second circuit path. The control circuit may be adapted to control the pass device (e.g., by means of feedback control) based on a quantity indicative of a current flowing through the second circuit path (second quantity). The control circuit may be adapted to control the pass device to operate in the constant current mode, e.g., to control the pass device such that the output current is substantially equal to a predetermined current value (e.g., target charge current). To this end, the control circuit may be adapted to control a voltage at a control terminal of the pass device. The linear charger circuit may yet further include a switching circuit coupled to the second circuit path. The switching circuit may be adapted to enable (e.g., activate) the first circuit path based on the quantity indicative of the current flowing through the second circuit path. The first circuit path may be current-free unless enabled by the switching circuit.

Configured as such, the proposed linear charger circuit allows to decrease the proportionality factor (e.g., sense ratio) between the actual charge current (e.g., battery current) and the current that is used for termination determination (i.e., at low charge current), without increasing current consumption at higher charge currents. Accordingly, the accuracy of termination current determination (i.e., determination of whether the charge current has reached or dropped below the termination current) can be significantly improved without adversely impacting power efficiency. This also corresponds to an increase of the dynamic range of the sense current.

In some embodiments, the linear charger circuit may include a multi-slice replica device. The multi-slice replica device may be coupled (e.g., connected) in parallel to the pass device, with its control terminal (e.g., gate terminal) coupled to the control terminal of the pass device. The multi-slice replica device may include a plurality of slices coupled (e.g., connected) in parallel. Each of the plurality of slices may be adapted to be coupled to either the first circuit path or the second circuit path. The slices coupled to the first circuit path may form the first replica device. The slices coupled to the second circuit path may form the second replica device. The multi-slice replica device may include one or more additional slices that are coupled to the second circuit path (without being switchable between the two circuit paths). These additional slices may also be part of the second replica device.

Since the multi-slice replica device offers the possibility of current trimming, the proposed circuit allows to use simple current sources for providing references for the charge current and the termination current, instead of more complicated and larger IDACs (current analog-to-digital converters). Thereby, the overall area of the linear charger circuit can be reduced compared to conventional linear charger circuits.

In some embodiments, the linear charger circuit may further include a first comparator circuit. The first comparator circuit may be adapted to, if the first circuit path is enabled, compare a quantity indicative of a current flowing through the first circuit path (first quantity) to a threshold for the quantity indicative of the current flowing through the first circuit path. The first comparator circuit may be further adapted to generate an indication of whether current output (e.g., a charge operation) by the linear charger circuit shall be terminated based on a result of the comparison. The indication of whether current output by the linear charger circuit shall be terminated may be a flag, e.g., a termination flag.

In some embodiments, the linear charger circuit may include a second comparator circuit and a switch device for coupling the first comparator circuit to the first circuit path to thereby enable the first circuit path. The first circuit path may be current-free unless coupled to the first comparator circuit. The second comparator circuit may be adapted to compare the quantity indicative of the current flowing through the second circuit path (second quantity) to a threshold for the quantity indicative of the current flowing through the second circuit path. The second comparator circuit may be further adapted to control the switch device based on a result of the comparison. The second comparator circuit and the switch device may be part of or may form the switching circuit.

In some embodiments, an on-state resistance of the first replica device may be smaller than an on-state resistance of the second replica device.

In some embodiments, a first number of slices among the plurality of slices may be coupled to the first circuit path and a second number of slices among the plurality of slices may be coupled to the second circuit path. Further, the replica device may include one or more additional slices that are coupled to the second circuit path.

In some embodiments, an on-state resistance of the parallel connection of those slices that are coupled to the first circuit path may be smaller than an on-state resistance of the parallel connection of those slices that are coupled to the second circuit path.

Accordingly, a ratio between the device sizes of the pass device and the replica device (sense ratio) is smaller when determining whether the termination current has been reached, e.g., at the end of the CV charging phase. This results in an increased accuracy for this determination and allows to reliably terminate the charge operation at the targeted termination current. Since the charge current is comparatively small at this point, the smaller sense ratio does not result in a significant increase of current consumption. On the other hand, the sense ratio is larger during the CC charging phase, whereby excessive current consumption at larger charge currents can be avoided.

In some embodiments, the switching circuit may be adapted to enable the first circuit path if the quantity indicative of the current flowing through the second circuit path (second quantity) drops below the threshold for the quantity indicative of the current flowing through the second circuit path. For example, the second comparator circuit may be adapted to control the switch device to couple the first circuit path to the first comparator circuit if the quantity indicative of the current flowing through the second circuit path drops below the threshold for the quantity indicative of the current flowing through the second circuit path (e.g., if the current flowing through the second circuit path drops below a corresponding current threshold). The switching circuit may be further adapted to disable (dis-enable, e.g., deactivate) the first circuit path if the quantity indicative of the current flowing through the second circuit path is above the threshold for the quantity indicative of the current flowing through the second circuit path. For example, the second comparator circuit may be further adapted to disconnect the first circuit path from the first comparator circuit if the quantity indicative of the current flowing through the second circuit path is above the threshold for the quantity indicative of the current flowing through the second circuit path (e.g., if the current flowing through the second circuit path is above a corresponding current threshold). The quantity indicative of the current flowing through the second circuit path (second quantity) may also be indicative of the output current (e.g., the actual charge current). The switching circuit (e.g., the second comparator circuit) may include a current source for generating a reference current for the current flowing through the second circuit path.

By selectively enabling the first circuit path (e.g., coupling the first circuit path to the first comparator circuit), high accuracy for current sensing can be achieved when needed, while overall current consumption can be kept under control.

In some embodiments, the first comparator circuit may be adapted to generate an indication that current output by the linear charger circuit shall be terminated (e.g., that the charge operation shall be terminated) if the quantity indicative of the current flowing through the first circuit path (first quantity) drops below the threshold for the quantity indicative of the current flowing through the first circuit path (e.g., if the current flowing through the first circuit path drops below a corresponding current threshold). The first comparator circuit may include a current source for sourcing/generating a threshold current for the current flowing through the first circuit path. The aforementioned indication accurately indicates whether the actual charge current has reached or dropped below the termination current and thus allows accurate termination of the charge operation at the termination current.

In some embodiments, the control circuit may be adapted to control the pass device further based on a reference for the quantity indicative of the current flowing through the second circuit path (second quantity). For example, the control circuit may be adapted to control the pass device based on a result of a comparison of the quantity indicative of the current flowing through the second circuit path and the reference value for the quantity indicative of the current flowing through the second circuit path. The reference value for the quantity indicative of the current flowing through the second circuit path may be indicative of (e.g., depend on, or be proportional to) a desired output current (e.g., the target charge current) during constant current operation. The control circuit may include a current sink for sinking/generating a reference current for the current flowing through the second circuit path, e.g., corresponding to the reference value for the quantity indicative of the current flowing through the second circuit path. Accordingly, the actual charge current can be controlled to a target value for the charge current during the CC charging phase.

In some embodiments, the linear charger circuit may further include a second control circuit coupled to the output node. The second control circuit may be adapted to control the pass device based on a quantity indicative of a voltage at the output node (third quantity). The second control circuit may be adapted to control the pass device further based on a reference for the quantity indicative of the voltage at the output node. For example, the second control circuit may be adapted to control the pass device based on a result of a comparison of (e.g., a difference between) the quantity indicative of the voltage at the output node and the reference for the quantity indicative of the voltage at the output node. Accordingly, the output voltage (e.g., charge voltage) can be controlled to a target value for the output voltage during the CV charging phase.

In some embodiments, the linear charger circuit may further include an equalization circuit (e.g., VDS equalizer circuit) for equalizing a voltage at an output terminal of the pass device that is arranged towards the output node of the linear charger circuit and a voltage at corresponding output terminals of the first and second replica devices (e.g., at corresponding output terminals of each of the plurality of slices of the multi-slice replica device). By providing suitable equalization, high accuracy of current sensing can be ensured, both during the CC charging phase and the CV charging phase.

In some embodiments, the linear charger circuit may further include a third control circuit adapted to control the pass device to stop current output based on an indication of whether current output by the linear charger circuit shall be terminated.

In some embodiments, the third control circuit may be further adapted to control the pass device to stop current output based on whether the first circuit path is enabled (e.g., based on an output of the second comparator circuit). Thereby, a particularly simple linear charger circuit can be realized, in particular if the difference between the target vale for the charge current and the termination current is small.

In some embodiments, the multi-slice replica device may be a digital-to-analog converter, DAC (e.g., replica DAC), having a plurality of switchable branches that are switchable for example in accordance with a digital control value input to the DAC. Each of the switchable branches may correspond to a respective one of the plurality of slices of the replica device. This offers for a particularly simple implementation of the multi-slice replica device.

In some embodiments, the pass device may include a first pass device portion and a second pass device portion that are coupled in parallel. The first pass device portion may be switched to the off-state based on whether the first circuit path is enabled (e.g., based on the result of the comparison by the second comparator circuit). For example, the first pass device portion may be switched to the off-state once the first circuit path is enabled (e.g., once the quantity indicative of the current flowing through the second circuit path (second quantity) drops below the reference for the quantity indicative of the current flowing through the second circuit path). The first pass device portion may have a larger device size (i.e., a lower on-state resistance) than the second pass device portion.

Thereby, the proportionality factor between the actual charge current (output current) and the current flowing through the first circuit path can be further decreased, so that the accuracy for monitoring the actual charge current in the vicinity of the termination current can be further improved. On the other hand, increased current consumption at higher charge currents can be avoided.

Another aspect of the disclosure relates to a method of operating a linear charger circuit. The linear charger circuit may include a pass device coupled (e.g., connected) between an input node and an output node of the linear charger circuit. The method may include providing first and second replica devices coupled (e.g., connected) in parallel to the pass device. Control terminals (e.g., gate terminals) of the first and second replica devices may be coupled (e.g., connected) to a control terminal (e.g., gate terminal) of the pass device. The method may further include coupling the first replica device to a first circuit path for determining whether current output by the linear charger circuit shall be terminated. Said determination may be based on a quantity indicative of a current flowing through the first circuit path (first quantity). The method may further include coupling the second replica device to a second circuit path for providing feedback for controlling the pass device. The method may further include controlling the pass device based on a quantity indicative of a current flowing through the second circuit path (second quantity). The method may yet further include enabling the first circuit path based on the quantity indicative of the current flowing through the second circuit path.

In some embodiments, the method may include providing a multi-slice replica device in parallel to the pass device. A control terminal (e.g., gate terminal) of the multi-slice replica device may be coupled (e.g., connected) to a control terminal (e.g., gate terminal) of the pass device. The multi-slice replica device may include a plurality of slices coupled (e.g., connected) in parallel. The method may further include coupling each of the plurality of slices to either the first circuit path or the second circuit path. The slices coupled to the first circuit path may form the first replica device. The slices coupled to the second circuit path may form the second replica device.

In some embodiments, the method may include, if the first circuit path is enabled, comparing a quantity indicative of a current flowing through the first circuit path (first quantity) to a threshold for the quantity indicative of the current flowing through the first circuit path. The method may further include generating an indication of whether current output by the linear charger circuit shall be terminated based on a result of the comparison.

In some embodiments, the method may include comparing the quantity indicative of the current flowing through the second circuit path (second quantity) to a threshold for the quantity indicative of the current flowing through the second circuit path. The method may further include enabling the first circuit path based on a result of the comparison.

In some embodiments, an on-state resistance of the first replica device may be smaller than an on-state resistance of the second replica device.

In some embodiments, the method may further include coupling a first number of slices among the plurality of slices to the first circuit path and coupling a second number of slices among the plurality of slices to the second circuit path.

In some embodiments, an on-state resistance of the parallel connection of those slices that are coupled to the first circuit path may be smaller than an on-state resistance of the parallel connection of those slices that are coupled to the second circuit path.

In some embodiments, the method may further include enabling the first circuit path if the quantity indicative of the current flowing through the second circuit path (second quantity) drops below the threshold for the quantity indicative of the current flowing through the second circuit path.

In some embodiments, the method may further include generating the indication that current output by the linear charger circuit shall be terminated if the quantity indicative of the current flowing through the first circuit path (first quantity) drops below the threshold for the quantity indicative of the current flowing through the first circuit path.

In some embodiments, the method may include controlling the pass device further based on a reference for the quantity indicative of the current flowing through the second circuit path (second quantity).

In some embodiments, the method may further include controlling the pass device based on a quantity indicative of a voltage at the output node (third quantity). For example, the pass device may be controlled by a second control circuit coupled to the output node.

In some embodiments, the method may further include equalizing a voltage at an output terminal of the pass device that is arranged towards the output node and a voltage at corresponding output terminals of the first and second replica devices (e.g., at corresponding output terminals of each of the plurality of slices of the multi-slice replica device).

In some embodiments, the method may further include controlling the pass device to stop current output based on an indication of whether current output by the linear charger circuit shall be terminated.

In some embodiments, the method may further include controlling the pass device to stop current output based on whether the first circuit path is enabled (e.g., based on a result of the comparison of the quantity indicative of the current flowing through the second circuit path to its respective threshold).

In some embodiments, the multi-slice replica device may be a digital-to-analog converter, DAC, having a plurality of switchable branches that are switchable for example in accordance with a digital control value input to the DAC. Each of the switchable branches may correspond to a respective one of the plurality of slices of the multi-slice replica device.

In some embodiments, the pass device may comprise a first pass device portion and a second pass device portion that are coupled in parallel. The first pass device portion may be larger (in terms of device size) than the second pass device portion. The method may further include switching the first pass device portion to the off-state based on whether the first circuit path is enabled (e.g., based on a result of the comparison of the quantity indicative of the current flowing through the second circuit path to its respective threshold).

Notably, the method may be applied to any of the circuits described above, for example as a method of operating these circuits. In addition to steps for operating these circuits, the method may further include steps for providing or arranging some or all of the elements of these circuits and/or steps for coupling or connecting respective elements of these circuits.

Moreover, it will be appreciated that method steps and apparatus features may be interchanged in many ways. In particular, the details of the disclosed method can be implemented as an apparatus adapted to execute some or all or the steps of the method, and vice versa, as the skilled person will appreciate. In particular, it is understood that methods according to the disclosure relate to methods of operating the circuits according to the above embodiments and variations thereof, and that respective statements made with regard to the circuits likewise apply to the corresponding methods.

It is also understood that in the present document, the term "couple" or "coupled" refers to elements being in electrical communication with each other, whether directly connected e.g., via wires, or in some other manner.

BRIEF DESCRIPTION OF THE DRAWINGS

Example embodiments of the disclosure are explained below with reference to the accompanying drawings, wherein like reference numbers indicate like or similar elements, and wherein FIG. 1 schematically illustrates an example of a linear charger circuit to which embodiment of this disclosure may be applied, FIG. 2 schematically illustrates a load voltage and a load current in the linear charger circuit of FIG. 1 as functions of time, FIG. 3 schematically illustrates an example of a linear charger circuit according to embodiments of the disclosure, FIG. 4 schematically illustrates another example of a linear charger circuit according to embodiments of the disclosure, FIG. 5 schematically illustrates a load voltage, a load current, a switching flag and a termination flag in the linear charger circuit of FIG. 4 as functions of time, FIG. 6 schematically illustrates yet another example of a linear charger circuit according to embodiments of the disclosure, and FIG. 7 schematically illustrates a load voltage, a load current, a switching flag and a termination flag in the linear charger circuit of FIG. 6 as functions of time.

DESCRIPTION

Figure 1:
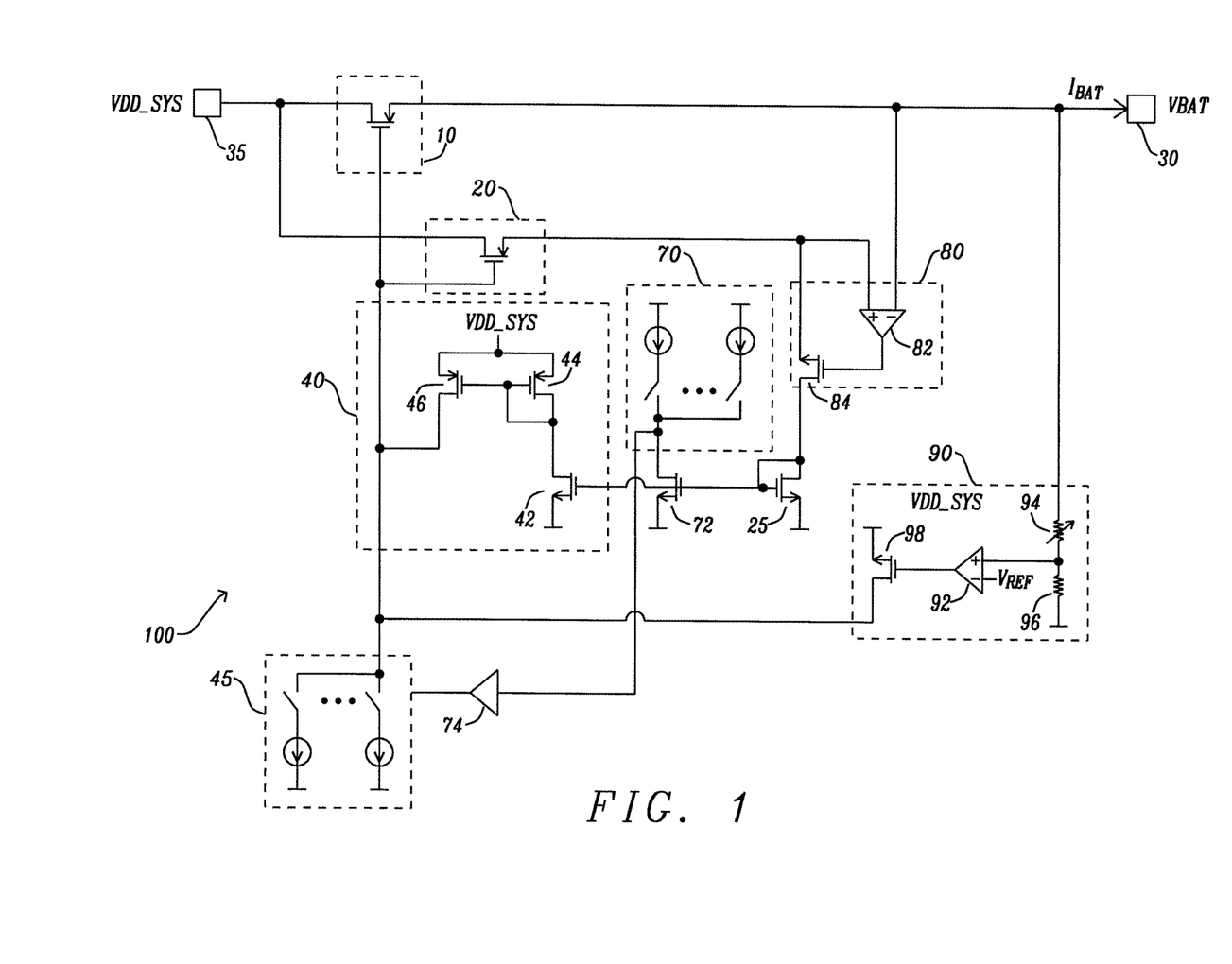

FIG. 1 schematically illustrates an example of a linear charger circuit 100 to which embodiment of this disclosure may be applied.

The linear charger circuit 100 may provide an output current (charge current) at an output node 30 to an electric load, such as a battery, for example. The linear charger circuit 100 comprises a pass device 10 and a replica device (sense device) 20. The pass device 10 and the replica device 20 may be field effect transistors (FETs), such as metal-oxide FETs (MOSFETS). For example, the pass device 10 and the replica device may be PMOS transistors (as shown in FIG. 1), or NMOS transistors. The pass device 10 is connected between an input node 35 of the linear charger circuit 100 and the output node 30. A supply voltage (input voltage) VDD_SYS may be supplied to the input node 35 of the linear charger circuit 100 (as well as to other nodes as discussed below). The replica device 20 is a replica of the pass device 10, but may differ from the pass device 10 with regard to device size (and thus, on-state resistance). The replica device 20 is connected in parallel to the pass device 10. Control terminals (e.g., gate terminals) of the pass device 10 and the replica device 20 are connected to each other. The pass device 10 and the replica device 20 may be said to form a current mirror.

The linear charger circuit 100 further comprises a VDS equalizer circuit (equalization circuit) 80 for equalizing the output voltages at respective output terminals (i.e., the terminals facing towards the electric load, such as the drain terminals, for example) of the pass device 10 and the replica device 20. In general, the equalization circuit serves to equalize a voltage at an output terminal of the pass device 10 that is arranged towards the output node 30 of the linear charger circuit 300 and a voltage at corresponding output terminal of the replica device 20. For equalized voltages, the current flowing through the pass device is in a predetermined ratio to the current flowing through the replica device, wherein this ratio is given by the ratio of the device sizes of the pass device and the replica device.

The VDS equalizer circuit may comprise an operational amplifier 82 and a first series-connected transistor device 84 (series connected with the replica device 20) that is coupled between the output terminal of the replica device 20 and ground. The operational amplifier 82 receives, at its positive and negative input ports, respectively, the voltage at the output terminal of the replica device 20 and the voltage at the output terminal of the pass device 10. The first series-connected transistor device 84 is controlled in accordance with an output of the operational amplifier 82 (e.g., a resistance, or a current flowing through the first series-connected transistor device 84, is controlled in accordance with the output of the operational amplifier 82).

A second series-connected transistor device 25 (series-connected with the replica device 20 and the first series-connected transistor device 84) is coupled between the first series-connected transistor device 84 and ground. The second series-connected transistor device 25 forms a first current mirror with a transistor device 72, and a second current mirror with a transistor device 42.

The transistor device 72 is coupled between a first IDAC 70 and ground. The first IDAC 70 generates (e.g., sources) a current that serves as a first reference current for determining whether to terminate the charge operation, i.e., that depends on (e.g., is proportional to) the termination current. The proportionality factor depends on the sense ratio between the pass device 10 and the replica device 20, and the mirror ratio of the first current mirror, as the skilled person will appreciate. As indicated above, the charge operation (current output by the linear charger circuit) shall be terminated once the actual charge current $I_{BAT}$ reaches or drops below the termination current $I_{TERM}$. The current flowing through the transistor device 72 (i.e., a current that depends on, e.g., is proportional to, the output current or actual charge current) is compared to the first reference current. A first difference current that depends on (e.g., is given by) a difference between the first reference current (generated by the first IDAC 70) and the current flowing through the transistor device 72 is tapped at an intermediate node between the first IDAC 70 and the transistor device 72.

A third current mirror (comprising transistor devices 44 and 46) is coupled in series with the transistor device 42 between the supply voltage VDD_SYS and ground and outputs a mirrored current of a current flowing through the transistor device 42. The mirrored current that is output by the third current mirror is compared to a current that is generated (e.g., sunk) by a second IDAC 45. The second IDAC 45 generates a current that serves as a second reference current for controlling the output current (i.e., the actual charge current $I_{BAT}$) during the CC charging phase. The second reference current is proportional to a target output current (target charge current $I_{CHARGE}$) during the CC charging phase. The proportionality factor depends on the sense ratio between the pass device 10 and the replica device 20, the mirror ratio of the second current mirror, and the mirror ratio of the third current mirror, as the skilled person will appreciate. The third current mirror and the transistor device 42 may be said to form a CC loop 40 for controlling the pass device 10 (and the replica device 20) during the CC charging phase. To this end, a second difference current that depends on (e.g., is given by or proportional to) a difference between the mirrored current and the second reference current (generated by the second IDAC 45) is tapped at an intermediate node between the third current mirror and the second IDAC 45. Said intermediate node is also coupled to the control terminals (e.g., gate terminals) of the pass device 10 and the replica device 20 In general, the CC loop 40 is coupled to said control terminals), so that the pass device 10 and the replica device 20 are controlled in accordance with the second difference current.

The first difference current may be amplified by an amplifier 74, and may be used for controlling the second IDAC 45. If the current flowing through the transistor device 72 falls below the first reference current, the charge operation should be terminated. This can be achieved, for example, by appropriate control of the second IDAC 45, in accordance with the (amplified) first difference current. In particular, the second IDAC 45 is controlled, in accordance with the (amplified) first difference current, such that the control terminals of the pass device 10 and replica device 20 are biased to switch off the pass device 10 and the replica device 20 once the charge operation shall be terminated.

The linear charger circuit 100 further comprises a CV loop 90 for controlling the pass device 10 and the replica device 20 during the CV charging phase. To this end, the load voltage (output voltage, or charge voltage) is tapped at an intermediate node between the pass device 10 and the output node 30, and the tapped voltage (or a predetermined fraction thereof, as determined by means of a voltage divider circuit of two (or more) series-connected resistors 94 and 96, of which one resistor 94 may be a variable resistor) is compared to a reference voltage $V_{REF}$ at an operational amplifier 92. An output of the operational amplifier 92 is used to control a transistor device 98 that is coupled between the supply voltage VDD_SYS and the intermediate node of the CC loop 40.

The accuracy of the charge current $I_{CHARGE}$ (during the CC charging phase) and the termination current $I_{TERM}$ (i.e., the charge current at which the charge operation is actually terminated) is in both cases defined by the structure of the CC loop 40, as both of them depend on a sense ratio between the pass device 10 and the replica device (sense device) 20 of the linear charger circuit 100, and the accuracy of the corresponding IDACs 45, 70 and the VDS equalizer circuit 80. For the high charge current setting of the second IDAC 45 (e.g., for $I_{CHARGE}$>200 mA) the accuracy of the CC loop 40 is mainly defined by the accuracy of the second IDAC 45 as the pass device 10 has significant overdrive voltage and therefore the matching between the replica device 20 and the pass device 10 is good in this region of a charger. Single digit accuracy can be achieved with the linear charger circuit 100 shown in FIG. 1. But in the lower range of the charge current (e.g., $I_{CHARGE}$<5 mA) the accuracy of the CC loop 40 degrades significantly.

The replica device 20 is one of the main contributors to this degradation of accuracy, because the IDAC current is set to its lowest current setting and the matching between the replica device 20 and the pass device 10 degrades due to the weak inversion operating region of the two devices (e.g., transistors).

A straightforward solution to this issue would seem to be to increase the device size of the replica device 20 and thereby decrease the pass device to replica device ratio (sense ratio). A drawback of this approach is the high current consumption that would then result for the maximum charge current. Simulations have shown that a realistic linear charger circuit would consume about 300 μA only for the CC loop. An increase of the replica device size by a factor of ten would increase the quiescent current for the CC loop to 3 mA, which is already about 1% of the maximum charge current. This is not acceptable for a wide range of applications.

Further simulations have shown that a spread of the charge current for which the standard deviation is about 1% of the charge current could be achieved, in the linear charger circuit under consideration, if the replica device size were increased by a factor of 100. This accuracy would be sufficient for a wide range of portable IoT device applications. On the other hand, the current consumption for high charge currents would be almost 31 mA, which is not acceptable at all.

Figure 3:
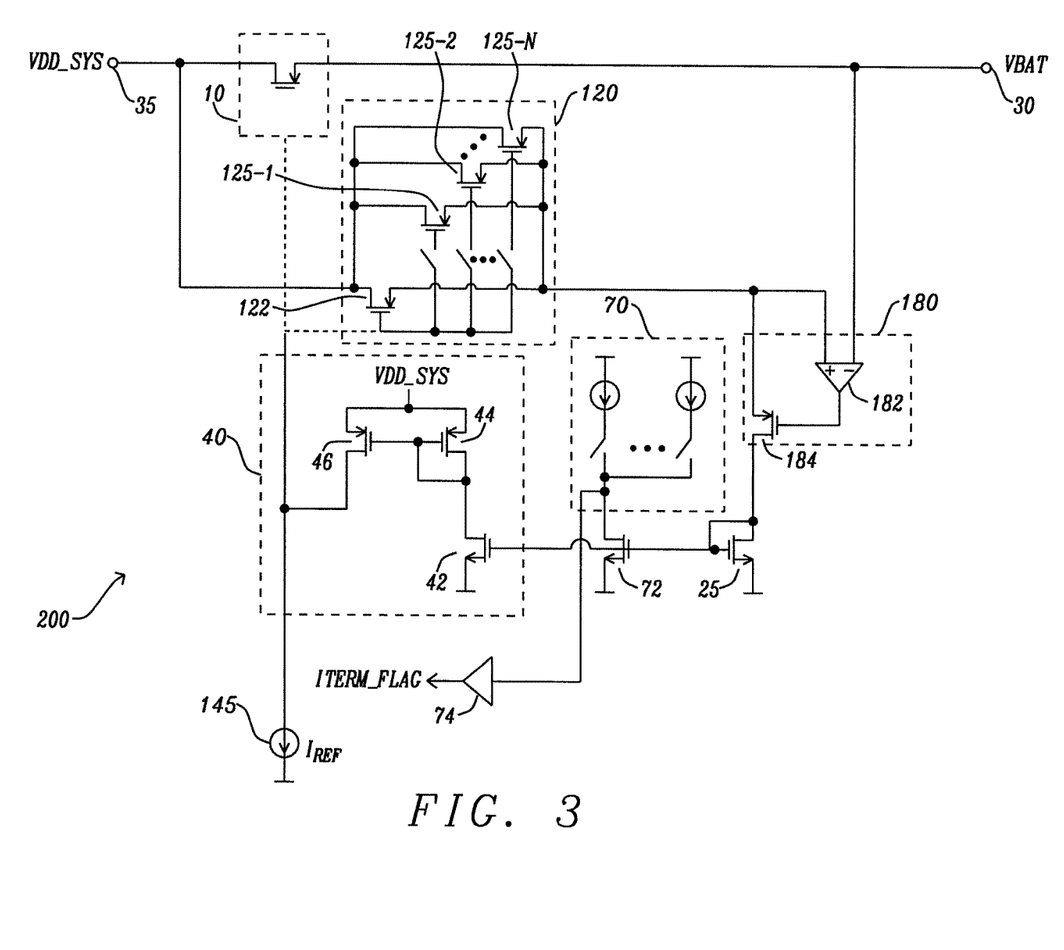

As has been found, sufficient charge current and termination current accuracy at acceptable current consumption can be achieved by dynamically changing the sense ratio. An example of a corresponding linear charger circuit 200 is shown in FIG. 3. Instead of varying the IDAC current so as to set different charge current ranges, this linear charger circuit 200 is adapted to dynamically change the sense ratio.

The linear charger circuit 200 comprises a pass device 10 and a replica device 20 that are arranged in the same manner as in the linear charger circuit 100 of FIG. 1. However, in this linear charger circuit, the replica device 20 comprises a plurality of slices (each slice comprising a respective transistor device; the plural transistor devices may be identical to each other in type and/or device size). The replica device 20 in this linear charger circuit may be referred to as a replica DAC or replica DAC circuit. The control terminal (e.g., gate terminal) of each of the slices' transistor devices may be connected to the control terminal (e.g., gate terminal) of the pass device 10 via a respective switch (there may also be one or more slices for which the control terminals of the transistor devices are directly, i.e., without switch, connected to the control terminal of the pass device 10). By switching one or more of these switches, the device size of the replica device 20 can be adjusted (scaled), whereby the sense ratio can be adjusted (scaled). Since the target charge current can be trimmed, the second reference current $I_{REF}$ (that eventually sets the charge current $I_{CHARGE}$) does not need to be generated by an IDAC, but can now be generated (e.g., sunk) by a simple current source (e.g., current sink) 145. In this linear charger circuit, the first difference current is used to generate a flag ($I_{TERM}$ FLAG) that indicates whether the charge operation shall be terminated. Otherwise, the linear charger circuit 200 is identical to the linear charger circuit 100 in FIG. 1. Notably, the linear charger circuit 200 may further comprise a CV loop (e.g., with the same internal configuration as the CV loop 90 in FIG. 1), which is not shown in FIG. 3 for reasons of simplicity.

This approach allows to achieve the required accuracy without current consumption increase for higher charge current settings, because the reference current $I_{REF}$ stays constant and therefore the current consumption of the linear charger circuit in the CC loop 40 stays constant. Another benefit of this scheme is the smaller area of the replica device compared to the IDAC approach of FIG. 1.

However, scaling the replica device alone does not archive the required accuracy for the termination current (i.e., for the actual charge current at which the charge operation is terminated, or the actual charge current for which the termination flag is raised). For example, if the target charge current $I_{CHARGE}$ is set to 300 mA the CC loop accuracy is now optimized for this current region. This means that the 1σ deviation of the charge current $I_{CHARGE}$ is about 1% of 300 mA (±3 mA). This holds true also for the termination flag ITERM_FLAG (i.e., the accuracy again is ±3 mA at 1σ), as it uses the same sense path as the CC loop. Now, if a termination current $I_{TERM}$ of 500 μA for a target charge current $I_{CHARGE}$ of 300 mA were desired, the linear charger circuit 200 could not accommodate for this, due to the aforementioned inaccuracy of current determination.

To address this issue, the present disclosure proposes scaling of the replica device (replica DAC) in conjunction with an Accuracy Tracking Scheme (ATS) to provide the best possible accuracy for the charge current $I_{CHARGE}$ and the termination current $I_{TERM}$, without increase in current consumption at high charge currents.

Figure 4:
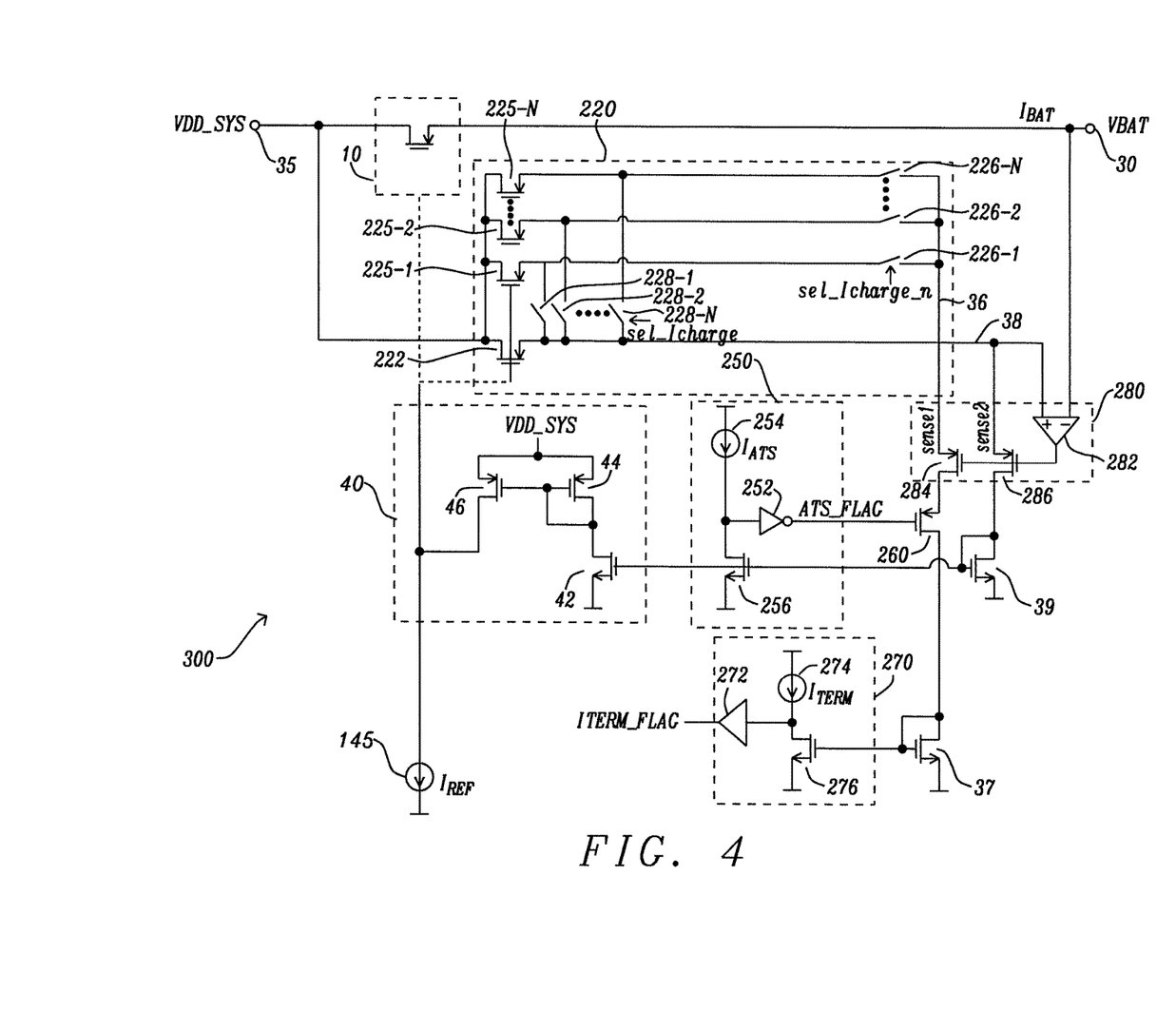

FIG. 4 shows an example of a linear charger circuit 300 according to embodiments of the disclosure. One main idea of the proposed linear charger circuit 300 (ATS charger) is to switch the sense ratio (and thereby change the current sense accuracy) based on a predefined current threshold $I_{ATS}$.

The linear charger circuit 300 comprises a pass device 10 and a replica device (sense device) 220 that are arranged in the same manner as in the linear charger circuit 100 of FIG. 1. The replica device 220 (e.g., replica DAC circuit) comprises a plurality of slices that are connected in parallel. Each of the plurality of slices is adapted to be coupled to either a first circuit path (first current path; sense1) 36 or a second circuit path (second current path; sense2) 38. That is, each of the plurality of slices may be switched to be either coupled to the first circuit path 36 or the second circuit path 38. Each of the plurality of slices comprises a transistor device 225-1, . . . , 225-N, of which a first terminal (e.g., source terminal) is connected to the input node 35 of the linear charger circuit 300 and second terminal (e.g., drain terminal) is connectable to the first circuit path 36 via a respective first switch 226-1, . . . , 226-N and is connectable to the second circuit path 38 via a respective second switch 228-1, . . . , 228-N. Notably, the first and second switches are controlled by complementary control signals sel_Icharge and sel_Icharge_n, so that at any point in time (disregarding a brief overlap or disoverlap phase that cannot be avoided in practice) one and only one of the first and second switches is closed for each of the plurality of slices. The replica device 220 may further comprise one or more additional slices that are fixedly coupled to the second circuit path 38. Each of these additional slices also comprises a transistor device 222, but does not comprise any switches. The transistor devices of the replica device 220 may be (but do not have to be) identical to each other (e.g., in type and device size).

The linear charger circuit 300 further comprises a VDS equalizer circuit (equalization circuit) 280 for equalizing voltages at the output terminals (e.g., drain terminals) of the pass device 10 and the replica device 220. The VDS equalizer circuit 208 ensures that the voltage drop across the replica device 220 (e.g., across each of its parallel transistor devices) is (substantially) the same as the voltage drop across the pass device 10. In the example of FIG. 4, the VDS equalizer circuit 282 comprises one first series-connected transistor device 284, 286 for each of the first and second circuit paths 36, 38. The first series-connected transistor devices are respectively series connected in the first and second circuit paths 36, 38. One of them (transistor device 284) is series connected in the first circuit path 36, and the other of them (transistor device 286) is series connected in the second circuit path 38. The VDS equalizer circuit 280 further comprises an operational amplifier 282 that receives, at its positive and negative input ports, the voltage on the second circuit path 38 at an output (e.g., drain) of respective replica transistor devices in the second circuit path 38 and the output voltage VBAT at the output node 30, respectively. Both the first series-connected transistor devices 284, 286 are controlled by the output of the operational amplifier 282. To this end, the output of the operational amplifier 282 is coupled to the control terminals (e.g., gate terminals) of the two first series-connected transistor devices 284, 286. In general, the equalization circuit 280 serves to equalize a voltage at an output terminal of the pass device 10 that is arranged towards the output node 30 of the linear charger circuit 300 and a voltage at corresponding output terminals of each of the plurality of slices of the replica device 220.

Each of the first and second circuit paths 36, 38 further comprises a second series-connected transistor device 37, 39. That is, each of the first and second circuit paths 36, 38 comprises a first series-connected transistor device and a second series-connected transistor device that are coupled between the replica device 220 and ground.

The linear charger circuit 300 further comprises a control circuit (CC control circuit) that is coupled to the second circuit path 38. In the example of FIG. 4, the control circuit is implemented by the CC loop 40 that has the same internal configuration as the CC loop in FIG. 1. The CC loop 40 (as an example of the control circuit) is coupled to the second circuit path 38 via its transistor device 42 that forms a current mirror with the second series-connected transistor device 39 in the second circuit path 38. The control circuit is adapted to control the pass device 10 (and each of the transistor devices of the replica device 220) based on a second quantity (e.g., current or voltage) indicative of a current flowing through the second circuit path 38. The second quantity depends on (e.g., is proportional to) the actual charge current (output current, load current) $I_{BAT}$ that flows through the pass device 10. The proportionality factor between the second quantity and the current flowing through the pass device may depend on the sense ratio between the pass device 10 and the transistor devices of the replica device 220 that are switched to the second circuit path 38.

The control circuit is adapted to control the pass device 10 (and each of the transistor devices of the replica device 220) based on the second quantity (e.g., current or voltage), and further based on a reference value for the second quantity. The control circuit may be said to compare the second quantity to its reference (e.g., a threshold value for the second quantity) and to control the pass device 10 (and each of the transistor devices of the replica device 220) accordingly, i.e., in accordance with a result of the comparison. In the example of FIG. 4, the reference for the second quantity is given by a reference current $I_{REF}$ that is generated (e.g., sunk) by a current source (e.g., current sink) 145 that is coupled to the control terminal (e.g., gate terminal) of the pass device 10 (and of each of the transistor devices of the replica device 220).

The linear charger circuit 300 further comprises a first comparator circuit 270 and a switch device (e.g., transistor device) 260 for coupling the first comparator circuit 270 to the first circuit path 36. The switch device 260 may be coupled in series between the first and second series-connected transistor devices 284, 37 in the first circuit path 36. The switch device 260 may be a transistor device, for example. If the switch device 260 is in the on-state, the first comparator circuit 270 may be coupled to the first circuit path. Otherwise, the first circuit path 36 may be current-free, i.e., no current may flow through the first circuit path 36 to ground.

In general, the linear charger circuit may be said to comprise a switching circuit (e.g., comprising the switch device 260) for enabling the first circuit path 36. The first circuit path 36 may be current-free unless enabled. Enabling the first circuit path 36 may correspond to coupling the first circuit path 36 to the first comparator circuit 270, for example.

The first comparator circuit 270 is adapted to compare a first quantity (e.g., current or voltage) that is indicative of the current flowing through the first circuit path to a threshold value (e.g., threshold current or threshold voltage) for the first quantity. The first quantity depends on (e.g., is proportional to) the actual charge current (output current, load current) $I_{BAT}$ that flows through the pass device 10. The proportionality factor between the first quantity and the current flowing through the pass device may depend on the sense ratio between the pass device 10 and the transistor devices of the replica device 220 that are switched to the first circuit path 36.

The first comparator circuit 270 is further adapted to generate an indication of whether current output by the linear charger circuit shall be terminated (i.e., whether the charge operation shall be terminated) based on the result of the comparison. The indication may be a flag (ITERM_FLAG), for example. The threshold value for the first quantity may depend on the (target) termination current $I_{TERM}$. For example, the first comparator circuit 270 may generate the indication once the first quantity drops below its threshold value (which would indicate, e.g., that the actual charge current $I_{BAT}$ drops below the termination current $I_{TERM}$). This indication may then be referred to by a suitable block of the linear charger circuit 300 to determine whether the charge operation shall be terminated.

If the switch device 260 is in the on-state, the first comparator circuit 270 may be coupled to the first circuit path 36 via the second series-connected transistor device 37 of the first circuit path 36. The first circuit path 36 may be said to be enabled in this event. For example, the first comparator circuit 270 may comprise a transistor device 276 that forms a current mirror with the second series-connected transistor device 37 of the first circuit path 36. Then, a current flowing through the transistor device 276 is indicative of (depends on, e.g., is proportional to) the current flowing through the first circuit path 36. This current may be compared to a reference current that may be generated (e.g., sourced) by a current source 274 of the first comparator circuit 270. The current source 274 of the first comparator circuit 270 may be coupled in series with the transistor device 276 of the first comparator circuit 270 between the supply voltage VDD_SYS and ground. A voltage or current may be tapped at an intermediate node between the current source 274 and the transistor device 276. This current or voltage may be used to generate the aforementioned indication, e.g., by supplying it to an amplifier 272. However, the present disclosure is not limited to this method for generating the aforementioned indication and other methods for generating said indication based on the first quantity and its threshold value (that depends on, e.g., is proportional to the termination current $I_{TERM}$) are feasible as well.

As a result, the first comparator circuit 270 is adapted to detect whether the actual charge current $I_{BAT}$ (i.e., the output current of the linear charger circuit 300) has reached (or drops below) the termination current $I_{TERM}$, at which point the charge operation should be terminated. In general, the first comparator circuit 270 is adapted to generate the aforementioned indication if the first quantity drops below the threshold for the first quantity. As indicated above, the aforementioned structure of the first comparator circuit 270 is understood to be a non-limiting example and other internal configurations of the first comparator circuit 270 that allow to determine or detect whether the actual charge current $I_{BAT}$ has reached the termination current $I_{TERM}$ are feasible as well.

The linear charger circuit 300 further comprises a second comparator circuit 250 that is coupled to the second circuit path 38. The second comparator circuit 250 and the switch device 260 may form the aforementioned switching circuit for enabling (and disabling) the first circuit path 36. The second comparator circuit 250 is adapted to compare the second quantity to a threshold for the second quantity and to control the switch device 260 based on a result of the comparison. The second comparator circuit 250 may be coupled to the second circuit path 38 via the second series-connected transistor device 39 of the second circuit path 38. For example, the second comparator circuit 250 may comprise a transistor device 256 that forms a current mirror with the second series-connected transistor device 39 of the second circuit path 38. Then, a current flowing through the transistor device 256 is indicative of (depends on, e.g., is proportional to) the current flowing through the second circuit path 38. This current may be compared to a reference current that may be generated (e.g., sourced) by a current source 254 of the second comparator circuit 250. The current source 254 of the second comparator circuit 250 may be coupled in series with the transistor device 256 of the second comparator circuit 250 between the supply voltage VDD_SYS and ground. A voltage or current may be tapped at an intermediate node between the current source 254 and the transistor device 256. This current or voltage may be used to generate a control signal (ATS_FLAG) for the switch device 260, e.g., by feeding it to an inverter 252. This control signal may be a flag (ATS_FLAG) that toggles the switch device 260 between its on-state (e.g., fully conducting state) and its off-state (e.g., non-conducting state). In general, the second comparator circuit 250 is adapted to control the switch device 260 to couple the first circuit path 36 to the first comparator circuit 270 if the second quantity drops below the threshold for the second quantity (and to disconnect the first circuit path 36 from the first comparator circuit 270 otherwise). In other words, the switching device is adapted to enable the first circuit path 36 if the second quantity drops below the threshold for the second quantity (and to disable the first circuit path 36 otherwise). Notably, the switch device 260 is arranged such that no current may flow through the first circuit path 36 when the switch device 260 is in the off-state (i.e., when the first circuit path 36 is disabled). Thereby, unnecessary current consumption by a current flowing through the first circuit path 36 can be avoided.

Although not shown in FIG. 4, the linear charger circuit 300 further comprises a second control circuit (CV control circuit) coupled to the output node 30. The second control circuit is adapted to control the pass device 10 based on a third quantity indicative of a voltage at the output node 30 (e.g., the load voltage VBAT). The second control circuit may be implemented by a CV loop having the internal structure of the CV loop 90 in the linear charger circuit 100 of FIG. 1.

The linear charger circuit 300 may further comprise a third control circuit (termination control circuit) that is adapted to control the pass device 10 to stop current output (i.e., to stop the charge operation) based on the indication of whether current output by the linear charger circuit shall be terminated. Alternatively or additionally, the third control circuit may be adapted to control the pass device 10 to stop current output based on an output of the second comparator circuit 250.

As can be seen from the above, the replica device 220 may be a DAC having a plurality of switchable branches that are switchable in accordance with a digital control value input to the DAC. Each of the switchable branches corresponds to a respective one of the plurality of slices of the replica device 220.

In the replica device 220 (e.g., replica DAC circuit), individual transistor devices (replica devices) can be disconnected from the second circuit path 38, which is the circuit path that is used for sensing the charge current during the CC charging phase, and can be coupled to the first circuit path 36. That is, the replica device 220 (e.g., replica DAC circuit) is now modified in such manner that the deselected transistor devices (replica devices) are switched to the first circuit path 36 (sense1 line) and the selected transistor devices (replica devices) are switched to the second circuit path 38 (sense2 line). Accordingly, a first number of slices among the plurality of slices are coupled to the first circuit path 36 and a second number of slices among the plurality of slices are coupled to the second circuit path 38. For each slice that is coupled to the first circuit path 36, the first switch of the respective slice is in the on-state and the second switch of the respective slid is in the off-state. Also, for each slice that is coupled to the second circuit path 38, the first switch of the respective slice is in the off-state and the second switch of the respective slice is in the on-state.

In general, the replica device 220 may be said to comprise a first replica device (including all those slices that are coupled to the first circuit path 36) and a second replica device (including all those slices that are coupled to the second circuit path 38). The first and second replica devices may form the replica device 220.

A current comparator circuit (e.g., the aforementioned second comparator circuit 250), which is generating the ATS_FLAG, is used to detect when the actual charge current (the output current $I_{BAT}$ of the linear charger circuit 300) falls below the $I_{ATS}$ threshold. This circuit acts as the accuracy selection element for ATS. If the ATS_FLAG goes down, it activates (enables), by switching the switch device 260 to the on-state, the first circuit path 36 to go to another current comparator (e.g., couples the first circuit path 36 to the first comparator circuit 270), which generates the indication whether the charge operation shall be terminated (ITERM_FLAG), to stop the charge operation. For example, if the target value for the charge current $I_{CHARGE}$ for the CC loop 40 is set to 300 mA (e.g., maximum charging current setting), the biggest sense to pass device ratio is chosen. It means the replica device 220 (replica DAC circuit) connects the smallest replica device (or the smallest possible number of slices) to the second circuit path 38 (sense2 line) and all the other replica devices to the first circuit path 36 (sense1 line). In general, the on-state resistance of the parallel connection of those slices (or, equivalently of those transistor devices or replica devices) that are coupled to the first circuit path 36 is smaller than the on-state resistance of the parallel connection of those slices (or, equivalently of those transistor devices or replica devices) that are coupled to the second circuit path 38. Thus, a sense to pass device ratio (in terms of device sizes) for the second circuit path 38 is smaller than the sense to pass device ratio for the first circuit path 36. Put differently, the sense device for the CC loop (the parallel connection of those slices that are coupled to the second circuit path 38) is smaller than the sense device for monitoring whether the termination current $I_{TERM}$ has been reached (the parallel connection of those slices that are coupled to the first circuit path 36). In terms of on-state resistance, the on state resistance of the sense device for the CC loop (the parallel connection of those slices that are coupled to the second circuit path 38) is larger than the on-state resistance of the sense device for monitoring whether the termination current $I_{TERM}$ has been reached (the parallel connection of those slices that are coupled to the first circuit path 36). Thus, the factor of proportionality between the actual charge current $I_{BAT}$ and the current flowing through the second circuit path 38 is larger than the factor of proportionality between the actual charge current $I_{BAT}$ and the current flowing through the first circuit path 36. thereby, sufficient accuracy at low charge currents can be achieved (for monitoring whether the termination current $I_{TERM}$ has been reached), while avoiding an increased current consumption at high charge currents.

After the charge operation goes into the CV loop operation (CV charging phase) the charge current will decrease. As the charge current $I_{BAT}$ current hits the $I_{ATS}$ level, the ATS_FLAG changes its state, switches the first circuit path 36 to the first comparator circuit 270, which compares the charge current level $I_{BAT}$ to the termination current level $I_{TERM}$, but now with the much bigger sense to pass device ratio. In certain implementations, if the difference between the target charge current $I_{CHARGE}$ and the target termination current $I_{TERM}$ is not high (e.g., 40 mA and 5 mA, respectively) the ATS_FLAG can be used to terminate the charge operation.

Figure 5:
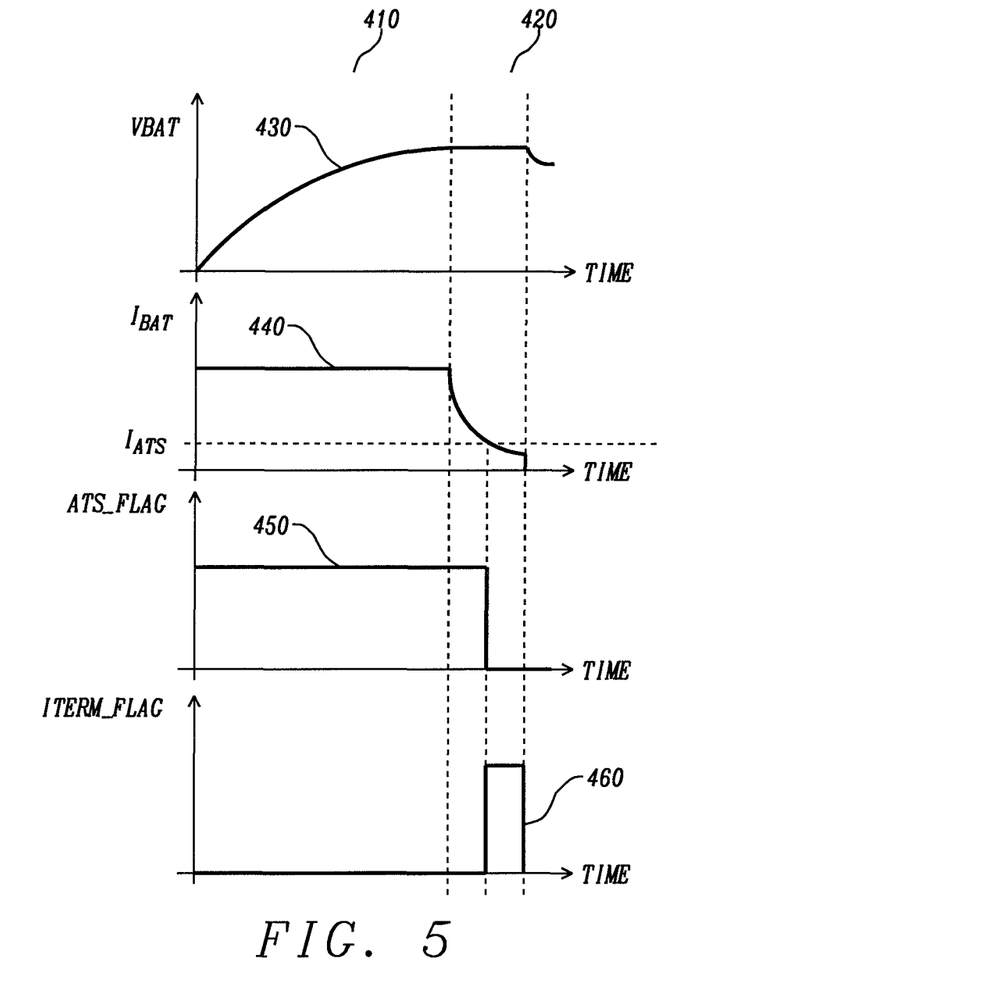

FIG. 5 schematically illustrates a load voltage, a load current, a switching flag (ATS_FLAG) and a termination flag (ITERM_FLAG) in the linear charger circuit 300 of FIG. 4 as functions of time. Graph 430 indicates the load voltage or charge voltage (e.g., battery voltage) VBAT, graph 440 indicates the actual charge current (e.g., battery current) $I_{BAT}$, graph 450 indicates the control signal for the switch device 260, ATS_FLAG, and graph 460 indicates the indication that the charge operation shall be terminated, ITERM_FLAG. The CC charging phase is indicated by reference 410, and the CV charging phase is indicated by reference 420. The charge voltage VBAT and the charge current $I_{BAT}$ have the same development over time as their counterparts in FIG. 2. The control signal (ATS_FLAG) for the switch device 260 toggles as soon as the charge current IBAT drops below the threshold IATS. Further, the indication that the charge operation shall be terminated, ITERM_FLAG toggles as soon as the charge current IBAT drops below the termination current ITERM.

Figure 6:
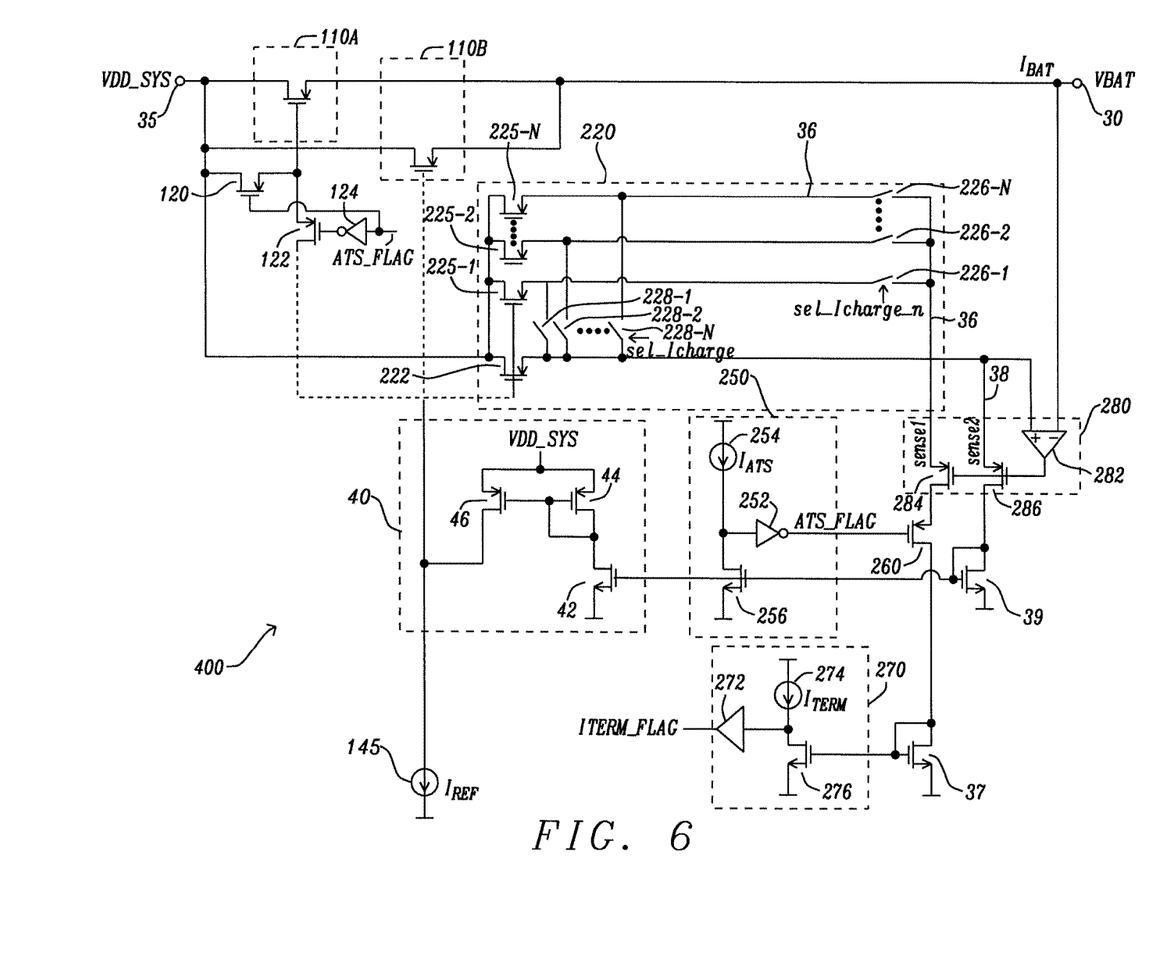

A further step to improve the ITERM accuracy using the ATS is shown in FIG. 6, which shows another example of a linear charger circuit 400 according to embodiments of the disclosure. Compared to the linear charger circuit 300 in FIG. 4, in the linear charger circuit 400 in the ATS_FLAG is now (also) used to change the pass device size of the linear charger circuit to further decrease the pass to sense device ratio or to save area in the replica DAC circuit for a required sense to pass device ratio for the specified ITERM accuracy. To this end, the pass device comprises a first pass device portion 110A and a second pass device portion 110B that are connected in parallel between the input node 35 and the output node 30 of the linear charger circuit 400. The first pass device portion 110A may have larger device size than the second pass device portion 110B. The first pass device portion 110A is switched to the off-state based on the result of the comparison by the second comparator circuit 250. For example, the first pass device portion 110A may be switched to the off-state if the second quantity drops below the threshold value for the second quantity (e.g., if the charge current IBAT drops below the IATS_THR threshold. In general, the first pass device portion 110A is switched to the off-state under control of the ATS_FLAG output by the second comparator circuit 250.

In more detail, the control terminal (e.g., gate terminal) of the first pass device portion 110A is disconnected from the control circuit (e.g., CC loop 40) under control of the ATS_FLAG, and is coupled to the supply voltage VDD_SYS. To this end, the linear charger circuit 400 may comprise additional transistor devices 120, 120 that are respectively coupled between the control terminal (e.g., gate terminal) of the first pass device portion 110 and the supply voltage VDD_SYS, and between the control terminal (e.g., gate terminal) of the first pass device portion 110 and the control circuit (e.g., CC loop 40). transistor device 120 is controlled in accordance with the ATS_FLAG (i.e., concurrently with the switch device 260), whereas transistor device 122 is controlled in an inverse manner, i.e., to open when the other transistor device 120 closes, and vice versa. To this end, an inverter 124 may be used to generate an inverted version of the ATS_FLAG.

In consequence, the proportionality factor between the charge current IBAT (i.e., the current flowing through the second pass device portion 110B) and the current flowing first circuit path 36 can be further decreased (once the charge current IBAT drops below the IATS threshold), and accuracy of termination current monitoring can be further increased. Accordingly, the proposed scheme allows to achieve high accuracy in termination current detection with low quiescent current and area consumption.

Figure 7:
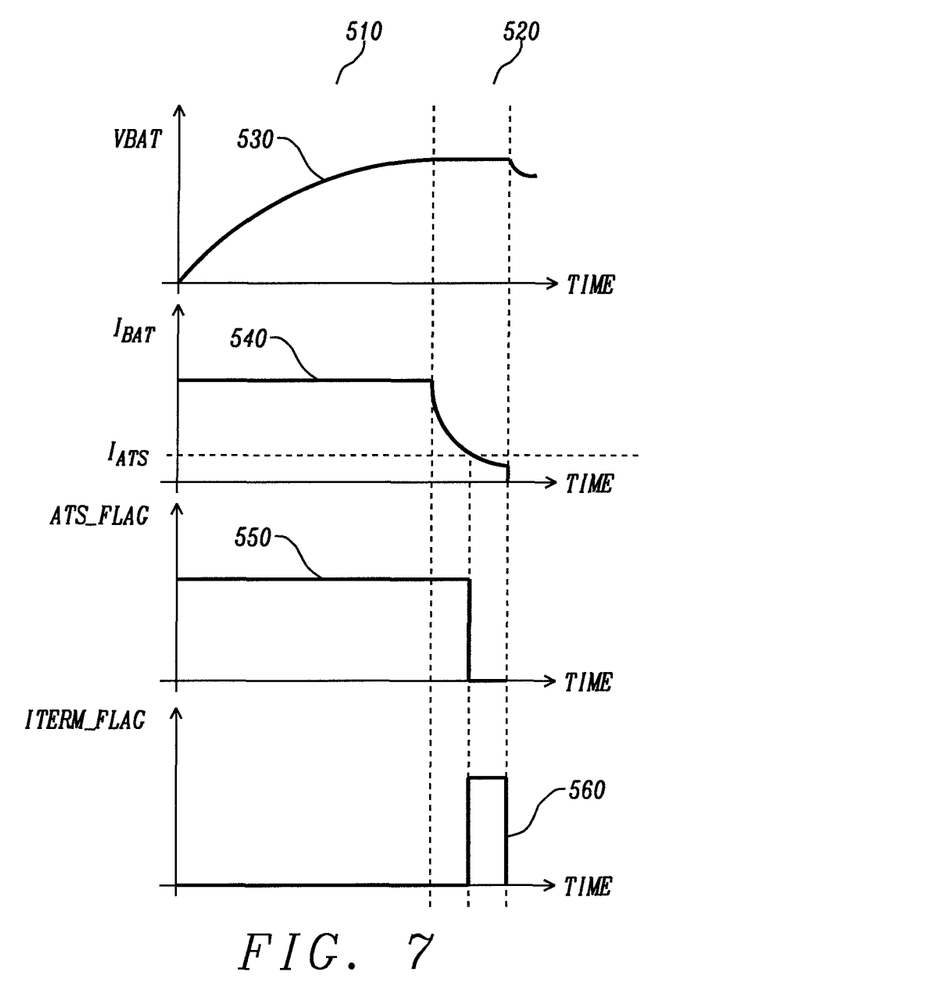

FIG. 7 schematically illustrates a load voltage, a load current, a switching flag and a termination flag in the linear charger circuit 300 of FIG. 6 as functions of time. Graph 530 indicates the load voltage or charge voltage (e.g., battery voltage) VBAT, graph 540 indicates the charge current (e.g., battery current) IBAT, graph 550 indicates the control signal for the switch device 260, ATS_FLAG, and graph 560 indicates the indication that the charge operation shall be terminated, ITERM_FLAG. The CC charging phase is indicated by reference 510, and the CV charging phase is indicated by reference 520. All quantities illustrated in this figure have the same development over time as their respective counterparts in FIG. 5.

In summary, the present disclosure proposes a technique (method and apparatus) to improve accuracy and dynamic range of the sense current (as an example of the termination current), which is not possible with conventional techniques. Several implementations have been described as non-limiting examples of the disclosure. It is understood that all transistors and transistor devices mentioned throughout the disclosure may be FETs, such as MOSFETs (e.g., PMOS transistors or NMOS transistors). It is further understood that while the drawings and example embodiments of the present disclosure relate to PMOS pass devices and replica devices, the present disclosure is also applicable to linear charger circuits with NMOS pass devices and replica devices, with evident modifications.

Unless indicated otherwise, elements of a series connection of two or more elements may be coupled (e.g., connected) to each other in any order, not just the order explicitly stated. It should be noted that the apparatus features described above correspond to respective method features that may however not be explicitly described, for reasons of conciseness. The disclosure of the present document is considered to extend also to such method features. In particular, the present disclosure is understood to relate to methods of operating the circuits described above, and/or to providing or arranging respective elements of theses circuits.

It should further be noted that the description and drawings merely illustrate the principles of the proposed circuits and methods. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. A linear charger circuit for providing an output current at an output node, the linear charger circuit comprising:
    a pass device connected between an input node and the output node;
    first and second replica devices connected in parallel to the pass device, with their control terminals coupled to a control terminal of the pass device, wherein the first replica device is coupled to a first circuit path for determining whether current output by the linear charger circuit shall be terminated and the second replica device is coupled to a second circuit path for providing feedback for controlling the pass device;
    a control circuit coupled to the second circuit path for controlling the pass device based on a quantity indicative of a current flowing through the second circuit path; and
    a switching circuit coupled to the second circuit path,
    wherein the switching circuit is adapted to enable the first circuit path based on the quantity indicative of the current flowing through the second circuit path.

2. The linear charger circuit according to claim 1, comprising a multi-slice replica device connected in parallel to the pass device, with its control terminal coupled to the control terminal of the pass device,
    wherein the multi-slice replica device comprises a plurality of slices connected in parallel, each of the plurality of slices being adapted to be coupled to either the first circuit path or the second circuit path; and
    the slices coupled to the first circuit path form the first replica device and the slices coupled to the second circuit path form the second replica device.

3. The linear charger circuit according to claim 1, further comprising a first comparator circuit, wherein the first comparator circuit is adapted to, if the first circuit path is enabled, compare a quantity indicative of a current flowing through the first circuit path to a threshold for the quantity indicative of the current flowing through the first circuit path, and to generate an indication of whether current output by the linear charger circuit shall be terminated based on a result of the comparison.

4. The linear charger circuit according to claim 3, wherein the switching circuit comprises a second comparator circuit and a switch device for coupling the first comparator circuit to the first circuit path to thereby enable the first circuit path; and
    the second comparator circuit is adapted to compare the quantity indicative of the current flowing through the second circuit path to a threshold for the quantity indicative of the current flowing through the second circuit path, and to control the switch device based on a result of the comparison.

5. The linear charger circuit according to claim 1, wherein an on-state resistance of the first replica device is smaller than an on-state resistance of the second replica device.

6. The linear charger circuit according to claim 2, wherein a first number of slices among the plurality of slices are coupled to the first circuit path and a second number of slices among the plurality of slices are coupled to the second circuit path.

7. The linear charger circuit according to claim 2, wherein an on-state resistance of the parallel connection of those slices that are coupled to the first circuit path is smaller than an on-state resistance of the parallel connection of those slices that are coupled to the second circuit path.

8. The linear charger circuit according to claim 4, wherein the switching circuit is adapted to enable the first circuit path if the quantity indicative of the current flowing through the second circuit path drops below the threshold for the quantity indicative of the current flowing through the second circuit path.

9. The linear charger circuit according to claim 3, wherein the first comparator circuit is adapted to generate an indication that current output by the linear charger circuit shall be terminated if the quantity indicative of the current flowing through the first circuit path drops below the threshold for the quantity indicative of the current flowing through the first circuit path.

10. The linear charger circuit according to claim 1, wherein the control circuit is adapted to control the pass device further based on a reference for the quantity indicative of the current flowing through the second circuit path.

11. The linear charger circuit according to claim 1, further comprising a second control circuit coupled to the output node, wherein the second control circuit is adapted to control the pass device based on a quantity indicative of a voltage at the output node.

12. The linear charger circuit according to claim 1, further comprising an equalization circuit for equalizing a voltage at an output terminal of the pass device that is arranged towards the output node and a voltage at corresponding output terminals of the first and second replica devices.

13. The linear charger circuit according to claim 1, further comprising a third control circuit adapted to control the pass device to stop current output based on an indication of whether current output by the linear charger circuit shall be terminated.

14. The linear charger circuit according to claim 13, wherein the third control circuit is further adapted to control the pass device to stop current output based on whether the first circuit path is enabled.

15. The linear charger circuit according to claim 2, wherein the multi-slice replica device is a digital-to-analog converter, DAC, having a plurality of switchable branches that are switchable in accordance with a digital control value input to the DAC, wherein each of the switchable branches corresponds to a respective one of the plurality of slices of the multi-slice replica device.

16. The linear charger circuit according to claim 1,
wherein the pass device comprises a first pass device portion and a second pass device portion that are coupled in parallel; and
the first pass device portion is switched to the off-state based on whether the first circuit path is enabled.

17. A method of operating a linear charger circuit having a pass device connected between an input node and an output node of the linear charger circuit,
the method comprising:
providing first and second replica devices in parallel to the pass device, with their control terminals coupled to a control terminal of the pass device;
coupling the first replica device to a first circuit path for determining whether current output by the linear charger circuit shall be terminated and coupling the second replica device to a second circuit path for providing feedback for controlling the pass device;
controlling the pass device based on a quantity indicative of a current flowing through the second circuit path; and
enabling the first circuit path based on the quantity indicative of the current flowing through the second circuit path.

18. The method according to claim 17, comprising:
providing a multi-slice replica device in parallel to the pass device, with its control terminal coupled to a control terminal of the pass device, wherein the multi-slice replica device comprises a plurality of slices connected in parallel; and
coupling each of the plurality of slices to either the first circuit path or the second circuit path,
wherein the slices coupled to the first circuit path form the first replica device and the slices coupled to the second circuit path form the second replica device.

19. The method according to claim 17, further comprising:
if the first circuit path is enabled, comparing a quantity indicative of a current flowing through the first circuit path to a threshold for the quantity indicative of the current flowing through the first circuit path, and generating an indication of whether current output by the linear charger circuit shall be terminated based on a result of the comparison.

20. The method according to claim 17, further comprising:
comparing the quantity indicative of the current flowing through the second circuit path to a threshold for the quantity indicative of the current flowing through the second circuit path, and enabling the first circuit path based on a result of the comparison.

21. The method according to claim 17, wherein an on-state resistance of the first replica device is smaller than an on-state resistance of the second replica device.

22. The method according to claim 18, further comprising:
coupling a first number of slices among the plurality of slices to the first circuit path and
coupling a second number of slices among the plurality of slices to the second circuit path.

23. The method according to claim 18, wherein an on-state resistance of the parallel connection of those slices that are coupled to the first circuit path is smaller than an on-state resistance of the parallel connection of those slices that are coupled to the second circuit path.

24. The method according to claim 20, further comprising:
enabling the first circuit path if the quantity indicative of the current flowing through the second circuit path drops below the threshold for the quantity indicative of the current flowing through the second circuit path.

25. The method according to claim 19, further comprising:
generating the indication that current output by the linear charger circuit shall be terminated if the quantity indicative of the current flowing through the first circuit path drops below the threshold for the quantity indicative of the current flowing through the first circuit path.

26. The method according to claim 17, comprising:
controlling the pass device further based on a reference for the quantity indicative of the current flowing through the second circuit path.

27. The method according to claim 17, further comprising:
controlling the pass device based on a quantity indicative of a voltage at the output node.

28. The method according to claim 17, further comprising:
equalizing a voltage at an output terminal of the pass device that is arranged towards the output node and a voltage at corresponding output terminals of the first and second replica devices.

29. The method according to claim 17, further comprising:
controlling the pass device to stop current output based on an indication of whether current output by the linear charger circuit shall be terminated.

30. The method according to claim 29, further comprising:
controlling the pass device to stop current output based on whether the first circuit path is enabled.

31. The method according to claim 18, wherein the multi-slice replica device is a digital-to-analog converter, DAC, having a plurality of switchable branches that are switchable in accordance with a digital control value input to the DAC, wherein each of the switchable branches corresponds to a respective one of the plurality of slices of the multi-slice replica device.

32. The method according to claim 17,
wherein the pass device comprises a first pass device portion and a second pass device portion that are coupled in parallel; and
the method further comprises:
switching the first pass device portion to the off-state based on whether the first circuit path is enabled.

* * * * *